United States Patent [19]

Michael

[11] Patent Number: 4,584,670
[45] Date of Patent: Apr. 22, 1986

[54] INTEGRATED DYNAMIC WRITE-READ MEMORY

[75] Inventor: Ewald Michael, Haar, Fed. Rep. of Germany

[73] Assignee: Siemens Aktiengesellschaft, Berlin and Munich, Fed. Rep. of Germany

[21] Appl. No.: 458,543

[22] Filed: Jan. 17, 1983

[30] Foreign Application Priority Data

Jan. 22, 1982 [DE] Fed. Rep. of Germany ....... 3202028

[51] Int. Cl.[4] ........................ G11C 7/00; G11C 11/24
[52] U.S. Cl. .................................. 365/149; 365/204; 365/189
[58] Field of Search ................ 365/149, 203, 189, 204

[56] References Cited

U.S. PATENT DOCUMENTS

| | | | |
|---|---|---|---|
| 3,986,180 | 10/1976 | Cade | 365/149 |
| 4,380,803 | 4/1983 | Tuan | 365/149 |
| 4,413,330 | 11/1983 | Chao et al. | 365/203 |
| 4,477,886 | 10/1984 | Au | 365/203 |

FOREIGN PATENT DOCUMENTS 0048936 4/1977 Japan .

OTHER PUBLICATIONS

Fujishima et al., "A Storage Node Boosted RAM with Word Line Delay Compensation", IEEE ISSCC Digest of Technical Papers, Feb. 10, 1982, pp. 66–67.
Stein et al., "Storage Array and Sense/Refresh Circuit for Single Transistor Memory Cells", IEEE Journal of Solid State Circuits, vol. SC-7, No. 5. Oct. 1972, pp. 336–340.

Primary Examiner—Stuart N. Hecker
Assistant Examiner—Glenn A. Gossage
Attorney, Agent, or Firm—Herbert L. Lerner; Laurence A. Greenberg

[57] ABSTRACT

Integrated dynamic write-read memory having a matrix formed of mutually identical memory cells based on MOS technology, the respective memory cells, in turn, being formed of a series arrangement of a transfer transistor and a storage capacitance, the memory cells belonging to individual columns of the matrix being connected, respectively, by a free current-carrying terminal of the transfer transistor thereof to a bit line assigned to the appertaining matrix column and being connected, respectively, by a free terminal of the storage capacitance thereof to a common fixed potential of the memory, comprising means for feeding a voltage, which causes discharge of the storage capacitance of the individual memory cells, across at least one pulsed circuit component of the matrix, for assisting in discharging the storage capacitance during an analysis of information stored in the individual memory cells.

12 Claims, 4 Drawing Figures

INTEGRATED DYNAMIC WRITE-READ MEMORY

The invention relates to an integrated dynamic write-read memory and more particularly, to such a memory having a matrix formed of memory cells constructed in accordance with MOS technology and identical to one another, the memory cells themselves being formed, respectively, of a series arrangement of a transfer transistor and a storage capacitance, the memory cells belonging to the individual matrix columns being connected, respectively, by a free current-carrying terminal of the transfer transistor thereof to a bit line which is assigned in common to the appertaining matrix column and being connected by a free terminal of the storage capacitance thereof to a common fixed potential of the memory.

Memory or storage circuits of this general type are described for example in "IEEE Journal of Solid-State Circuits", Vol. SC-7 (Oct. 1972), pages 336–340.

In the conventional organization of such dynamically operated write-read memories, each column of the memory matrix is assigned a respective bit line running parallel to the columns and connected to the single-transistor memory cells provided in the appertaining matrix column, the bit line being connected to the first input of a comparator formed by a bistable trigger stage. The second signal input of the comparator is connected to a comparator cell (dummy cell) which, in conjunction with the comparator, affords the determination of the digital operating state of a memory cell selected by addressing.

Both the individual memory cells and the comparator cell are formed of so-called single-transistor memory cells. They are accordingly formed, respectively, of a self-locking MOS transfer transistor, especially of the n-channel type, having a source and a drain, respectively, connected to the assigned bit line, and having a gate connected to the word line which is assigned to the respective memory or storage cell and which runs along the matrix row containing the respective memory or storage cell. The other current-carrying terminal (drain and source, respectively) of the transfer transistor of the relevant memory cell is connected to the pole of a storage capacitor formed especially by a MOS varactor, the storage capacitor having a second pole connected to a fixed potential of the circuit. A dummy line corresponding to the word line and addressed simultaneously therewith is provided for the comparator cell, whereas the source and the drain, respectively, of the transfer transistor thereof are connected to the other information carrying terminal of the comparator. Otherwise, the circuit of the comparator cell (dummy cell) meets the conditions which prevail in the actual memory cells. The transfer transistors of the memory cells respectively assigned to the individual matrix rows are commonly connected by the gates thereof to the word line which conveys the addressing of the respective matrix row. In FIG. 1 of the instant application, there is provided a circuit diagram of a conventional single-transistor memory cell having a switching or transfer transistor T which is connected by the drain terminal thereof to an associated bit line BL, by the gate thereof to the associated word line WL, and by the source terminal thereof to a first pole $P_1$ of a storage capacitor C, while a second pole $P_2$ of the storage capacitor C is connected to a fixed potential of the memory circuit. If an addressing signal characterized by a logic state "1" is supplied simultaneously via the word line WL and via the bit line BL, the transfer transistor T becomes conductive so that the storage capacitor is able to charge and discharge, respectively. For this purpose, the second pole $P_2$ of the capacitor C of the memory cell is connected to a fixed potential V which, for example, can be identical to the reference potential (ground) of the memory circuit.

If the bit line BL, on the other hand, simultaneously with the presence of an addressing signal on the word line WL, is connected to the reference potential (ground) i.e. to a logic level "O", any possibly existing storage charge is discharged from the storage capacitor C via the transfer transistor T or else is regenerated, depending upon the value of the fixed potential V at the pole $P_2$ of the storage capacitor C. These processes for the logic level "O" and logic level "1" apply to the read and write operation of the memory. It is also possible to regenerate the charge which indicates the operating state "1" or "0" in the storage capacitor C, for which purpose, the comparator respectively provided in the individual matrix rows is used in a conventional manner together with the associated comparator cell.

The state of charge of the storage capacitor C thus corresponds either to the logic level "0" or the logic level "1" and, accordingly, to the digital information stored in the appertaining memory cell. The transfer transistor T can be controlled by the word line signal so that, depending upon the desired item of information, the storage capacitor can be charged or discharged via the bit line BL. At the time of recording, the information on the bit line is determined ("O"=$V_{ss}$, "1"=$V_{cc}$) and transferred to the storage capacitor C of the respective addressed memory cell. At the time of read-out, the precharge potential of the bit line BL is modified by the connection of the capacitor C via the transfer transistor T to the respective associated bit line BL and is compared with a reference potential (supplied by the comparator cell which is connected to the same comparator as the memory cell under consideration via the comparator, the difference thus established is amplified and is further processed by a common evaluation stage.

Because it is desirable, in integrated semiconductor memory technology, to achieve a monolithic combination of the largest possible number of memory cells in the matrix, the individual single-transistor memory cells must be given an even smaller construction which obviously presents problems in particular with regard to the size of the storage capacitor C and, thereby, with regard to the reliability of evaluating the charges stored in the individual memory cells as "0" and "1" information, respectively.

Therefore, it is desirable to obtain, as reliably and effectively as possible, an evaluation of the respective quantity of charge stored in the individual memory cells and comparator cells (dummy cells).

The measure of setting the inner resistance of the transfer transistors T as low as possible during the read operation of the memory cell operates along these lines. In addition, it is possible to increase the efficiency of the read-out of the stored charges by reducing the bit line capacity.

It is accordingly an object of the invention to provide an integrated dynamic write-read memory with a further measure which is effective along the aforementioned lines and which can be used both by itself as well as in combination with the possibilities described hereinbefore.

With the foregoing and other objects in view, there is provided, in accordance with the invention, an integrated dynamic write-read memory having a matrix formed of mutually identical memory cells based on MOS technology, the respective memory cells, in turn, being formed of a series arrangement of a transfer transistor and a storage capacitance, the memory cells belonging to individual columns of the matrix being connected, respectively, by a free current-carrying terminal of the transfer transistor thereof to a bit line assigned to the appertaining matrix column and being connected, respectively, by a free terminal of the storage capacitance thereof to a common fixed potential of the memory, comprising means for feeding a voltage, which causes discharge of the storage capacitance of the individual memory cells, across at least one pulsed circuit component of the matrix, for assisting in discharging the storage capacitance during an analysis of information stored in the individual memory cells.

In accordance with other features of the invention, the pole facing away from the transfer transistor of the storage capacitors provided in the individual memory cells is connected via pulsed additional transfer transistors (note FIG. 3), on the one hand, to the terminal for the first supply potential and on the other hand to the terminal for the reference potential (earth). Relevant details in this regard are provided hereinafter in the description of FIG. 3.

The invention is based upon the recognition that it is possible to increase markedly the reliability of the read-out of information contained in the individual memory cells and therewith the sensitivity of the storage capacitance by departing from the conventional measure of employing a fixed potential V for the pole $P_2$ of the storage capacitance C in the individual single-transistor memory cells uninterruptedly during the operation of the memory cells and, instead, supplying the potential V for the pole $P_2$ of the storage capacitance in pulsed form to the latter. The aforementioned advantage becomes especially noticeable when the storage capacitance C of the individual memory cell and comparator cell is realized, respectively, by a MOS varactor having a gate which is not directly connected to the constant potential V, as is normal, but is operated with this potential, for example, by a pulsed further self-blocking MOS transistor of the same type as that of the transfer transistor T.

This is preferably effected, in accordance with the invention, as previously mentioned herein, by having the pole $P_2$, which faces away from the transfer transistor T of the individual storage cells, connected, on the one hand, via pulsed further transfer transistors $t_2$ and $t_3$ to the reference potential (earth) and, on the other hand, to the other operating potential. Because experience has shown that the measure proposed by the invention results in a considerable improvement in information read-out and, furthermore, the technical expense associated with the invention can be kept low by the use of a common pulsing or clock element for the memory cells and comparator cells, particularly since the operation of a dynamic memory, in any event, requires a clock or pulse generator, the invention may be used with advantage in all appropriate situations.

As mentioned hereinbefore, in most cases, the storage capacitance C of the individual memory cells is realized by a respective MOS varactor of conventional construction wherein the drain (or the source) of the transfer transistor T extends beneath a further gate electrode which is separated from the semiconductor body of the arrangement by a gate oxide layer and which then forms the pole $P_2$ of the respective storage capacitance. In accordance with the invention the read-out potential V is then applied to the pole $P_2$ in pulsed form. By optimizing the effect, the time sequence of the requisite clock or pulse voltage can readily be adapted or matched to the existing circuit constellation (e.g. a positive or a negative starting voltage for the storage capacitors C, to an excessive or a nonexcessive word line signal, and so forth. With respect to the effect striven for by the invention, it is essential to reduce the potential V at the pole $P_2$ in direction towards the other operating potential, in the case of the storage cells connected to the addressed word lines WL at the time of the word line selection. This can be effected, for example, by operating the circuit in order to reduce the potential at the second pole $P_2$ of the storage capacitances C during the switching of the word line itself when addressing. The reduction can also be triggered, however, by a decoded pulse which starts immediately prior to the actual read-out signal.

In accordance more specifically with an additional feature of the invention, the storage capacitance has a pole facing away from the respective transfer transistor serially arranged therewith, and including a word line assigned to the appertaining matrix row and having the gate of the respective transfer transistor connected thereto, and means for effecting the pulsing of the circuit component by temporarily disconnecting and connecting the voltage applied to the respective storage capacitance at the pole, the disconnection and connection being adjusted to respective signals in the word line and the bit line provide for application to the respective memory cell.

In accordance with an added feature of the invention, the means for applying the voltage to the pole of the storage capacitance is connected thereto via at least one pulsed MOS field effect transistor.

In accordance with yet another feature of the invention, each matrix row and each word line of the memory are respectively assigned a first one of the circuit components having a pulsed voltage supplied to the pole of the respective storage capacitance for triggering the memory cells assigned to the respective word line, the first circuit components being of identical construction, and including a second one of the circuit components for controlling the first circuit components in common.

In accordance with yet a further feature of the invention, the first circuit component includes an RS flip-flop connected to a reference potential, and three additional transistors, the RS flip-flop having transistors of the same type as that of the three additional transistors and having a first signal output connected via a first one of the additional transistors acting as a resistance to a first operating potential, the RS flip-flop having another output connected, on one hand, to the word line assigned to the respective first circuit component and, on the other hand, to a gate of a second one of the three additional transistors, the second and a third transistor of the additional transistors having source-drain paths arranged in series, the series arrangement of the second and third additional transistors being connected by a gate of the third additional transistor to the RS flip-flop and to a pulsed voltage supplied by the second circuit component, the series arrangement of the second and third additional transistors being also connected via the second additional transistor to a supply potential, the series arrangement of the second and third additional transistors having a circuit point located between the transistors of the series arrangement and connected to the pole of the storage capacitance assigned to the first circuit component.

In accordance with yet an additional feature of the invention, the first operating potential provided for feeding the first component is at least equal to the supply potential.

In accordance with yet an added feature of the invention, the first operating potential is slightly greater than the supply potential.

In accordance with an alternate feature of the invention, the first operating potential is exactly equal to the supply potential. In accordance with a still further feature of the invention, the second circuit component serves to commonly feed the first circuit component and includes six further transistors of the same type as those of the transfer transistors in the first circuit component and in the memory cells, three of the further transistors having the source-drain paths thereof connected in series, a first one of the three further transistors being connected by the drain thereof to the supply potential, and by the source thereof, on the one hand, to the source of the additional transistors to which the pulsed voltage is applied in the first circuit components and, on the other hand, to the drain of a second one of the three further transistors of the second circuit component, the source terminal of the second one of the three further transistors being connected to the gate and the drain of a third one of the three further transistors, the source of the third one of the three transistors being connected to the reference potential of the memory, the gates of the first one and the second one of the three further transistors being controlled, respectively, in pulsed form.

In accordance with a concomitant feature of the invention, a fourth transistor of the second circuit component has a drain by which it is connected to the supply potential, a gate by which it is connected to a first clock signal, and a source by which it is connected both to the gate of the first one of the three further transistors and to the gate of a fifth transistor of the second circuit component and to the drain of a sixth transistor of the second circuit component, and including a second clock signal controllingly connected simultaneously to the source and to the drain of the fifth transistor of the second circuit component, and a third clock signal controllingly connected to the gate of the sixth transistor of the second circuit component together with the gate of the second one of the three further transistors in the second circuit component, the source of the sixth transistor of the second circuit component being directly connected to the reference potential.

In accordance with a further feature of the invention, the integrated memory includes first means for supplying the first clock signal to the fourth transistor of the second circuit component, second means for supplying the second clock signal to the fifth transistor of the second circuit component, and third means for supplying the third clock signal to the second one of the three further transistors and to the sixth transistor of the second circuit component, the first, second and third signal supplying means being of such construction that the third clock signal is inverted relative to the first clock signal, the first clock signal and the second clock signal having falling sides coincident as to time, the first clock signal having a rising side slightly preceding a rising side of the second clock signal.

In accordance with a further aspect, the invention includes a method of operating an integrated memory which comprises imparting a slight increase to the word line signal during read-out.

Other features which are considered as characteristic for the invention are set forth in the appended claims.

Although the invention is illustrated and described herein as embodied in integrated dynamic write-read memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
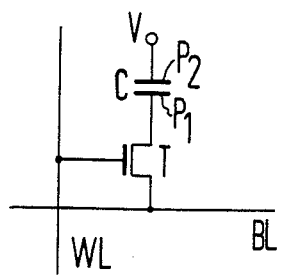
FIG. 1 is a circuit diagram of a conventional single-transistor memory cell.
Figure 2:
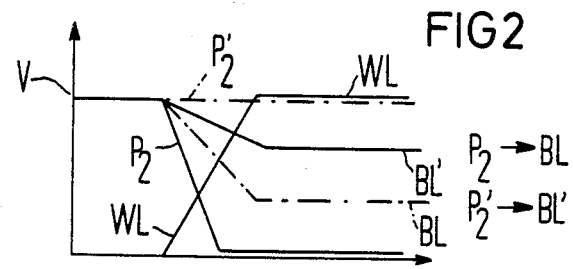
FIG. 2 is a plot diagram of time characteristics of a bit line potential for the conventional memory cell of FIG. 1.

Referring now again to the drawings and first, particularly to FIG. 2 thereof, there are represented in FIG. 2, the time characteristics of the bit line potential BL wherein the pole $P_2$ of the capacitance C is subjected to the pulsed application of the fixed potential V compared with a situation wherein the pole $P_2$ has the potential V constantly applied thereto (the bit line potential BL′ and the potential curve $P_2'$ across the pole $P_2$) and in fact for the case wherein a logical "0" stored in a cell according to FIG. 1 is read out. The pulsed potential at the pole $P_2$ is designated as "$P_2$" and the behavior of the potential on the bit line BL resulting from the pulsing is designated as "BL". Finally, the behaviour of the potential of the word line WL assigned to the memory cell has also been designated as "WL".

The negative side of the potential at the pole $P_2$ of the storage capacitance C (contingent upon the pulsing) results, due to the coupling to the pole $P_1$ of the capacitance, in a greater reduction in the bit line potential during the read-out of the information "0" (note the curve designated "BL") than a constant voltage V at the pole $P_2$ (note the curve designated "BL′" in FIG. 2). This provides a greater change in the potential of the associated bit line BL and therefore a larger read-out signal. The activation of the single transistor memory cell represented in FIG. 1 for the behavior illustrated in FIG. 2 occurs as a result of the behavior of the transfer transistor T to which the latter is subjected by the word line signal (opening of the transistor T by the positive side of the word line signal, and so forth.

Even if the single transistor memory cell is formed merely by a pn-junction remaining between the drain and the substrate of the transfer transistor T during the operation in the blocking direction, the use of the invention likewise leads to an increase in the reliability of the information read-out. It is quite clear, furthermore, that the clock pulse voltage must be selected so that the operation of the memory cell and of the remaining memory can proceed satisfactorily.

Generally, the pulsing will adjust to or coordinate with the normal operation of the mutually identical memory cells including the dummy cells, so that the clock pulse voltage V across the pole $P_2$ of the storage capacitor C remains constant for all of the cells which are not to be read out. The magnitude of the clock pulse voltage depends upon the selected embodiment, respectively, of the memory cells and the respective modulation being used. When the starting voltage of the cell varactor C is positive, the positive supply voltage $V_{cc}$ of the storage circuit will be used, for example, as maximum value of the clock pulse voltage. In order to read out the cells, on the other hand, the potential across the pole $P_2$ is reduced in the direction of the reference potential (ground). In the case of a negative starting voltage or a starting voltage of 0 V for the cell varactor C, it is possible to use a maximum clock pulse voltage 0 V (ground) which is reduced in the direction of negative values during read-out. It may generally be asserted that the clock pulse side is selected in accordance with the realization or construction (technology and modulation) of the cell that, during the read-out of the cell, it accelerates the discharge of the cell capacitance C but does not invalidate or falsify the charge state. The start of the clock pulse side is determined by the instant or time of the cell selection; the clock pulse should preferably be terminated prior to the instant of write-in in order to achieve the greatest possible charges of the cell capacitances during write-in.

In all cases, the falling side at the pole $P_2$ of the storage capacitance C facing away from the transfer transistor T (which may, under certain conditions, also be identical to the drain-substrate-pn-junction) results in a further decrease in the $V_{ss}$-potential, generated during the write-in, at the other pole $P_1$ of the storage capacitance C directly prior to the read-out of the digital information stored in the respective individual memory cell as a result of the pulsing, and the pre-charged bit line BL receives an effectively larger read-out signal for a "0" stored as information. When the "0" is written-in, the pole $P_1$ of the storage capacitance C can be maintained at the potential $V_{ss}$ via the bit line BL, whereas the other pole $P_2$ of the storage capacitance is returned to a higher voltage. In this way it is possible to prevent successfully coupling-up of the pole $P_1$ and, consequently, impairment of the stored logic level "0" information.

When the logic level "1" information is written-in (i.e. thus a bit having the information potential $V_{cc}$ on the appertaining bit line BL), either the coupling up of the pole $P_1$ is permitted (prior to read-out, the opposite coupling occurs so that the recorded "1" (i.e. thus the potential $V_{cc}$ at the pole $P_1$ of the storage capacitance C remains unchanged) or else the pole $P_1$ of the storage capacitance C is maintained at the $V_{cc}$ potential (via the bit line BL), whereas the pole $P_2$ returns to a higher level.

With regard to the hereinaforedescribed behavior, it should be noted that all the transistors, thus especially the transfer transistors T, must then be formed of n-channel transistors of the self-blocking type. When p-channel transistors are used, the same condition prevails but with reversed signs. In this case, the starting voltage of the storage capacitance C prevents a negative coupling to the pole $P_1$ during the negative side of the potential carried by the pole $P_2$ of the storage capacitance C during the read-out. Here again a recorded "1" remains unchanged at the instant of read-out.

Figure 3:
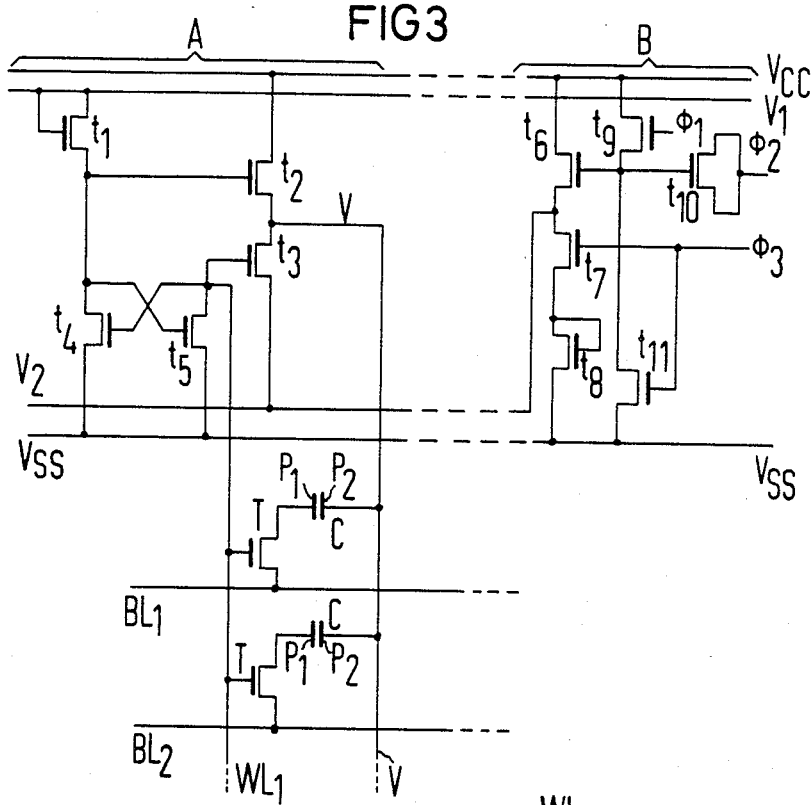
FIG. 3 is a circuit diagram of an integrated dynamic write-read memory according to the invention.
Figure 3A:
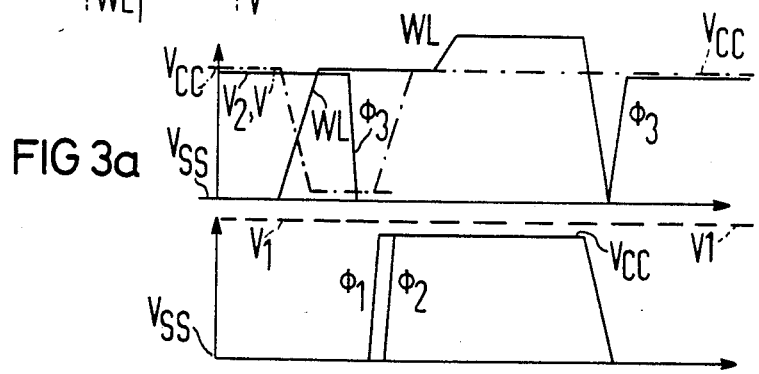
FIG. 3a is a plotted voltage-time diagram associated with the embodiment of the invention shown in FIG. 3.

FIG. 3 illustrates a favorable exemplary embodiment of a circuit constructed in accordance with the invention, and FIG. 3a represents the associated time diagram.

The circuit illustrated in FIG. 3 has a number of circuit parts or components A which are respectively assigned in common to one of the word lines WL and, accordingly, to the single transistor memory cells T, C appertaining to a respective word line WL. Expressed in opposite language, every row of the matrix of the memory has one such circuit part A. For the common control of all of these circuit parts A, a circuit part R is provided which is itself fed by the supply potentials $V_{cc}$ and $V_{ss}$ and by the three clock pulse signals $\phi_1$, $\phi_2$ and $\phi_3$.

Each of the hereinaforementioned circuit part A contains an RS flip-flop which is formed of two transistors $t_4$ and $t_5$ of the same type as that of the transfer transistors T in the individual memory cells and comparator cells. The source terminals of the two transistors $t_4$ and $t_5$ are connected to the reference potential $V_{ss}$ whereas, in order to achieve the flip-flop effect, the gates thereof are connected to the drain of the respective other of the two transistors and thus to a respective one of the two signal outputs of the RS flip-flops $t_4$, $t_5$. The output of the flip-flop, which is formed by the drain of the transistor $t_4$, is connected via a further transistor $t_1$ which is connected as a resistor and which is of the same type as the previously mentioned transistors, to a fixed potential $V_1$ which is slightly higher than the supply potential $V_{cc}$ used in addition to the reference potential $V_{ss}$. This has also been taken into account in the lower plot diagram of FIG. 3a. The other output i.e. the drain of the transistor $t_5$, is connected to the word line WL and thus to the gates of the transfer transistors T, assigned to the respective word line WL of the associated storage cells.

The series arrangement of two further MOS field-effect transistors, thus the transistors $t_2$ and $t_3$, which are of the type as that of the previously mentioned transistors, is on the one hand connected to the aforementioned supply potential $V_{cc}$ and on the other hand to a potential $V_2$ supplied by the circuit part or component B. The gate of the transistor $t_3$ of this series arrangement, which is directly connected to the potential $V_2$, is connected to the output of the RS flip-flop $t_4$, $t_5$ which is formed by the drain of the transistor $t_5$ and which serves to supply the associated word line WL. The drain of the transistor $t_3$ and thus the source of the transistor $t_2$ of the aforementioned series arrangement $t_2$, $t_3$ is directly connected to the poles $P_2$ of the storage capacitances C belonging to the memory cells and comparator cells, respectively, assigned to the appertaining circuit part or component A, and thus supplies the pulsed potential $V_2$ required for the supply thereof. The transistor $t_2$ of the aforementioned series arrangement has a drain directly connected to the supply potential $V_{cc}$, and a gate directly connected to the other output of the RS flip-flop i.e. to the drain of the transistor $t_4$.

The potential $V_1$ serving to supply the gate and the drain of the aforementioned transistor $t_1$, which is connected as a resistor, and the potential $V_2$ which is required to supply the source of the transistor $t_3$ in the individual circuit parts or components A are commonly supplied by one circuit part or component. The circuit part B responsible for supplying the transistors $t_3$ with the potential $V_2$ has additionally been shown in FIG. 3. On the other hand, the circuit part or component which serves to supply the potential $V_1$ has not been illustrated in detail since this circuit component can be made directly understandable from the description of circuit component B.

For generating the potential $V_2$, the circuit part or component B is provided with a series arrangement of three MOS transistors $t_6$, $t_7$ and $t_8$, as well as three further transistors $t_9$, $t_{10}$, $t_{11}$ which are all of the same type as that of the previously mentioned transistors, thus, in the case of the illustrated embodiment, they are of the self-blocking n-channel type.

Both the series arrangement of the three transistors $t_6$, $t_7$ and $t_8$, as well as a series arrangement formed of the two transistors $t_9$ and $t_{11}$, is supplied, on the one hand, by the supply potential $V_{cc}$ and, on the other hand, by the reference potential $V_{ss}$ (ground). Moreover, a common clock pulse signal $\phi_3$ is provided for the control of the gates of the transistors $t_7$ and $t_{11}$, a further clock pulse signal $\phi_2$ is provided for the supply of source and drain of the transistor $t_{10}$, and a third clock pulse signal $\phi_1$ is provided for the control of the gates of the transistor $t_9$.

In the series arrangement formed of the three transistors, the transistor $t_6$ is controlled by the clock pulse $\phi_1$ is connected by the drain thereof to the supply potential $V_{cc}$ and by the source terminal thereof, on the one hand, to those points of the circuit parts or component A which are to be supplied with the potential $V_2$ and, on the other hand, to the drain of the MOS transistor $t_7$ which is controlled by the clock pulse $\phi_3$. The MOS transistor $t_7$ is connected by the source terminal thereof to the drain and the gate of the transistor $t_8$, the source terminal of which is directly connected to the reference potential $V_{ss}$.

In the series arrangement formed of only two transistors, the transistor $t_9$ which is controlled by the clock pulse $\phi_1$ is connected by the drain thereof to the supply potential $V_{cc}$ whereas the other transistor $t_{11}$ of this series arrangement (the gate of which is connected to the clock pulse $\phi_3$) is connected by the source thereof to the reference potential (ground) $V_{ss}$ of the circuit.

The MOS transistor $t_{10}$ which is controlled by the clock pulse $\phi_2$ is connected as a varactor, the drain and the source of this transistor $t_{10}$ being directly connected to one another and to the clock pulse signal $\phi_2$. The gate of this transistor $t_{10}$ is connected to a circuit node between the two transistors $t_9$ and $t_{11}$ of the series arrangement which is formed of two transistors and, consequently, likewise to the gate of the transistor $t_6$ of the series arrangement which is formed of three transistors $t_6$, $t_7$ and $t_8$.

The time curve of the clock pulses which are provided for the control of the circuit part or component B is represented in the two diagrams in FIG. 3a. In this regard, it should be noted that the clock pulses $\phi_1$ and $\phi_3$ are inverted relative to one another, the falling sides of the clock pulses $\phi_1$ and $\phi_2$ being in synchronism with one another and the rising flank $\phi_2$ being slightly delayed with respect to the rising flank of $\phi_1$.

As a result of the capacitive effect of the clock pulse $\phi_2$ on the gate of the transistor $t_{10}$, the potential across the gate of this transistor $t_{10}$ and, thus, the potential across the source of $t_9$ and across the gate of $t_6$ are somewhat increased time-wise.

By using a further MOS transistor connected as a varactor in the manner of the transistor $t_{10}$ it is possible to increase somewhat the potential of a circuit component supplied with the reference potential $V_{cc}$ and, in this way, to generate the potential $V_1$ required for the operation of the circuit part or component A.

With regard to the function of the circuit represented in FIG. 3, the following should be noted: the part or component B generates the pulse train $V_2$, as is apparent from FIG. 3a, which is needed for the operation of the part or component A. The transistors $t_1$, $t_4$ and $t_5$ ensure that a non-selected word line WL is maintained at the reference potential $V_{ss}$ (ground). The transistor $t_3$ facilitates the pulsing (at the common pole $V_2$ of the cell varactor C) in selected cells of a word line, thus a word line WL to which a positive potential is applied by the timing or clock pulse $V_2$.

The pulsing of the poles $P_2$ of the selected storage capacitances C is effected through a circuit point between the two transistors $t_2$ and $t_3$ which are arranged in series.

It is apparent from FIG. 3a that a word line clock pulse WL, which has been increased in terms of time, is used. Therefore, at the instant of the increase, the potential V is set at the value of the potential $V_2$ without any drop in voltage by the transistor $t_3$.

The circuit illustrated in FIG. 3 for the pulsing of the read-out signal for the individual storage cells has the following advantages, amongst others:

(a) A common setting or adjustment of the pulsing by the circuit part or component B.

(b) The parts or components A which are commonly controlled by the part B generally cause only an additional expense for the two transistors $t_2$ and $t_3$, since the transistors $t_1$, $t_4$ and $t_5$ are also needed, quite apart from the invention, for the suppression of interferences. Therefore, the extra expense in terms of chip surface or area conditioned by the clock pulse circuit is entirely justified. The two additional transistors $t_2$ and $t_3$ can also be accommodated without difficulty.

(c) The generation of the positive side of the potential V by the potential $V_2$ in FIG. 3 prior to the instant of write-in (note FIG. 3a and the increase in the WL signal represented therein) permits larger quantities of charge to be written into the respective selected storage capacitances C.

It is fundamentally possible for the potential $V_1$ seen in FIGS. 3 and 3a to be identical with the reference potential $V_{cc}$. However, the use of a potential $V_1$ which is somewhat greater than the potential $V_{cc}$ provides the advantage that the charging potential V can also be increased or exceeded somewhat.

In order to achieve an increase in the potential $V_1$ relative to the supply potential $V_{cc}$ in a relatively simple manner, it is possible, as has been already indicated, to use the principle employed in the case of the transistor $t_{10}$ in the circuit part or component B, in accordance with FIG. 3. A first transistor corresponding to the transistor $t_{10}$ is supplied at the source and the drain thereof by a clock pulse signal $\phi_2$ in an identical manner. A second transistor corresponding to the transistor $t_9$ in FIG. 3 connects the gate of the first transistor to the potential $V_{cc}$ and is, moreover, controlled by the clock pulse $\phi_1$. The potential $V_1$ can then be tapped from the gate of the first transistor.

The same method can also be used in order to achieve an increased word line signal WLif in the combination of the two transistors $t_9$ and $t_{10}$ seen in FIG. 3, the transistor t₉ is fed from the source which supplies the word line signal instead of the supply potential $V_{cc}$ and the gate of the transistor $t_{10}$ is connected to the word line which is to be supplied with the increased word line signal. (Naturally, the two transistors $t_9$ and $t_{10}$ of the circuit illustrated in FIG. 3 are not used for this purpose, but rather two further transistors independent of the circuit shown in FIG. 3 are used). It is also possible, however, to use only one pulsed transistor corresponding to the transistor $t_{10}$, the pulsed transistor having a gate connected to the word line WL which is fed an addressing signal in a conventional manner.

The construction illustrated in FIGS. 3 and 3a of the write-read memory according to the invention has proved to be especially successful. However, as will be readily apparent to an individual skilled in the art, there are other possibilities for realizing or practising the invention.

The foregoing is a description corresponding to German Application P 32 02 028.7, dated Jan. 22, 1982, International Priority of which is being claimed for the instant application, and which is hereby made part of this application. Any discrepancies between the foregoing specification and the specification of the aforementioned corresponding German application are to be resolved in favor of the latter.

I claim:

1. Integrated dynamic write-read memory having mutually identical memory cells based on MOS technology and arranged as columns and rows in a matrix, the memory cells, respectively, being formed of a series arrangement of a transfer transistor of the enhancement type and a storage capacitance, the write-read memory further having a plurality of bit lines, each of which is assigned to one of the matrix columns, the transfer transistor of each of the memory cells of a respective matrix column having a channel path with a free terminal connecting the respective memory cell to the bit line assigned to the respective matrix column, and the storage capacitance of each of the memory cells having a free pole connecting the respective memory cell to a common potential of the write-read memory, comprising means for applying a pulsed voltage at the common potential to the free pole of the storage capacitance via a pulsed circuit part of the matrix which, during a read-out of information stored in the individual memory cells, effectively accelerates a discharge of the memory cells resulting from the read-out.

2. Integrated memory according to claim 1 including means for generating the pulsed voltage by switching between two different potentials, the pulsed voltage having a time rate of change depending upon electrical signals occurring at word lines and at the respective bit lines.

3. Integrated memory according to claim 2 wherein said means for applying said voltage to said pole of said storage capacitance is connected thereto via at least one pulsed MOS field effect transistor.

4. Integrated memory according to claim 1 wherein each matrix row and each word line of the memory are respectively assigned a first one of said circuit components having a pulsed voltage supplied to said pole of the respective storage capacitance for triggering the memory cells assigned to the respective word line, the first circuit components being of identical construction, and including a second circuit component for controlling said first circuit components in common.

5. Integrated memory according to claim 4 wherein said first circuit component comprises an RS flip-flop connected to a reference potential, and three additional transistors, said RS flip-flop having transistors of the same type as that of said three additional transistors and having a first signal output connected via a first one of said additional transistors acting as a resistance to a first operating potential, said RS flip-flop having another output connected, on one hand, to the word line assigned to the respective first circuit component and, on the other hand, to a gate of a second one of said three additional transistors, said second and a third transistor of said additional transistors having source-drain paths arranged in series, said series arrangement of said second and third additional transistors being connected via the source of said second additional transistor to a pulsed voltage supplied by said second circuit component, said series arrangement of said second and third additional transistors being also connected via said third additional transistor to a supply potential, the gate of said third transistor being connected to said first signal output of said RS flip-flop, said series arrangement of said second and third additional transistors having a circuit point located between said transistors of said series arrangement and connected to said pole of the storage capacitance assigned to said first circuit component.

6. Integrated memory according to claim 5 wherein said first operating potential provided for feeding said first component is at least equal to said supply potential.

7. Integrated memory according to claim 6 wherein said first operating potential is slightly greater than said supply potential.

8. Integrated memory according to claim 6 wherein said first operating potential is exactly equal to said supply potential.

9. An integrated memory according to claim 8 wherein a slight increase is imparted to the word line signal during read-out.

10. Integrated memory according to claim 5 wherein said second circuit component serves to commonly feed said first circuit components and comprises six further transistors of the same type as those of the transfer transistors in said first circuit component and in said memory cells, three of said further transistors having the source-drain paths thereof connected in series, a first one of said three further transistors being connected by the drain thereof to said supply potential, and by the source thereof, on the one hand, to said source of said additional transistors to which said pulsed voltage is applied in said first circuit components and, on the other hand, to the drain of a second one of said three further transistors of said second circuit component, the source terminal of said second one of said three further transistors being connected to the gate and the drain of a third one of said three further transistors, the source of said third one of said three further transistors being connected to said reference potential of the memory, the gates of said first one and said second one of said three further transistors being controlled, respectively, in pulsed form.

11. Integrated memory according to claim 10 wherein a fourth transistor of said second circuit component has a drain by which it is connected to said supply potential, a gate by which it is connected to a first clock signal, and a source by which it is connected both to the gate of the first one of said three further transistors and to the gate of a fifth transistor of said second circuit component and to the drain of a sixth transistor of said second circuit component, and including a second clock signal controllingly connected simultaneously to the source and to the drain of said fifth transistor of said second circuit component, and a third clock signal controllingly connected to the gate of said sixth transistor of said second circuit component together with the gate of the second one of said three further transistors in said second circuit component, the source of said sixth transistor of said second circuit component being directly connected to said reference potential.

12. Integrated memory according to claim 11 including first means for supplying said first clock signal to said fourth transistor of said second circuit component, second means for supplying said second clock signal to said fifth transistor of said second circuit component, and third means for supplying said third clock signal to said second one of said three further transistors and to said sixth transistor of said second circuit component, said first, second and third signal supplying means being of such construction that said third clock signal is inverted relative to said first clock signal, said first clock signal and said second clock signal having falling sides coincident as to time, said first clock signal having a rising side slightly preceding a rising side of said second clock signal.

* * * * *